(12) United States Patent
Stasiak

(10) Patent No.: US 7,276,727 B2
(45) Date of Patent: Oct. 2, 2007

(54) ELECTRONIC DEVICES CONTAINING ORGANIC SEMICONDUCTOR MATERIALS

(75) Inventor: James Stasiak, Lebanon, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 8 days.

(21) Appl. No.: 11/039,444

(22) Filed: Jan. 18, 2005

(65) Prior Publication Data

US 2005/0151130 A1 Jul. 14, 2005

(51) Int. Cl.
 *H01L 35/24* (2006.01)
(52) U.S. Cl. .................. 257/40; 438/99; 257/E39.007; 257/E51.001; 257/E27.117
(58) Field of Classification Search ...................... None
See application file for complete search history.

(56) References Cited

U.S. PATENT DOCUMENTS

| | | | |
|---|---|---|---|
| 5,250,990 A | 10/1993 | Fujimura et al. ........... 355/211 |
| 5,556,716 A | 9/1996 | Herron et al. .............. 428/688 |
| 5,612,228 A | 3/1997 | Shieh et al. .................... 437/1 |
| 5,707,779 A | 1/1998 | Naito |
| 5,912,473 A | 6/1999 | Wakita et al. ................. 257/40 |
| 5,946,551 A | 8/1999 | Dimitrakopoulos et al. .. 438/90 |
| 6,001,523 A | 12/1999 | Kemmesat et al. ........... 430/96 |
| 6,055,180 A | 4/2000 | Gudesen et al. ............ 365/175 |
| 6,197,663 B1 | 3/2001 | Chandross et al. ......... 438/455 |
| 6,207,472 B1 | 3/2001 | Callegari et al. ............. 438/99 |
| 6,252,245 B1 | 6/2001 | Katz et al. ..................... 257/40 |
| 6,265,243 B1 | 7/2001 | Katz et al. ..................... 438/99 |
| 6,329,226 B1 | 12/2001 | Jones et al. ................. 438/151 |
| 6,344,660 B1 * | 2/2002 | Dimitrakopoulos et al. .. 257/40 |
| 6,420,734 B1 * | 7/2002 | Ishimaru ....................... 257/91 |
| 6,465,892 B1 | 10/2002 | Suga .......................... 257/777 |
| 6,498,049 B1 | 12/2002 | Friend et al. ................. 438/34 |
| 6,670,645 B2 * | 12/2003 | Grushin et al. ............... 257/98 |
| 6,828,685 B2 * | 12/2004 | Stasiak ....................... 257/777 |

FOREIGN PATENT DOCUMENTS

| | | |
|---|---|---|
| EP | 0478368 A1 | 9/1991 |
| EP | 0532798 A | 3/1993 |
| EP | 0658815 A1 | 6/1995 |
| EP | 1079397 A1 | 2/2001 |

OTHER PUBLICATIONS

"Electric Field Dependence of Thermally Stimulated Currents in DEH Doped Polycarbonate" by J.W. Stasiak and T.J. Storch, Inc. Boulder, Colorado; from 'IS&T: The Society for Imaging Science and Technology; 1997 International Conference on Digital Printing Technologies' pp. 261-265.

"Photochemically Induced Disorder in Molecularly Doped Polymers" by J.W. Stasiak, T.J. Storch and E. Mao; Lexmark International, Inc., Boulder Colorado from 'IS&T: The Society for Imaging Science and Technology; Proceedings of IS&T's Eleventh International Congress on Advances in Non-Inmpact Printing Technologies' pp. 147-151.

(Continued)

*Primary Examiner*—Wai-Sing Louie

(57) ABSTRACT

An electronic device includes first and second electrical contacts electrically coupled to a semiconductor polymer film, which includes mono-substituted diphenylhydrazone.

40 Claims, 6 Drawing Sheets

OTHER PUBLICATIONS

"Hole Mobilities in Photochemically Modified DEH-Doped Polycarbonate" by J.W. Stasiak and T.J. Storch; Lexmark International, Inc., Boulder Colorado; from 'Journal of Imaging Science and Technology' vol. 40, No. 4, Jul./Aug. 1996 pp. 299-303.

"Xerographic Photoreceptors and Photorefractive Polymers", by Stephan Ducharme & Paul M. Borsenberger from 'Proceedings-SPIE-The International Society for Optical Engineering' vol. 2526, Jul. 1995; pp. 23-29.

"Xerographic Photoreceptors and Organic Photorefractive Materials II", by Stephan Ducharme & James W. Stasiak from 'Proceedings-SPIE-The International Society for Optical Engineering' vol. 3144, Jul. 1997; pp. 72-79.

"Organic Photorefractive Materials and Xerographic Photoreceptors", by Stephen Ducharme & James W. Stasiak from 'Proceedings-SPIE-The International Society for Optical Engineering' vol. 2850 Aug. 1996; pp. 172-180.

"Thermally stimulated currents in molecularly doped polymers" by J.W. Stasiak and T.J. Storch; Lexmark International Boulder, CO 80301; from "Xerographic Photoreceptors and Organic Photorefractive Material II, SPIE vol. 3144"; Jul. 1997, pp. 72-79.

"Organic Photoreceptors for Xerography" by Brian J. Thompson, from 'Infrared Technology Fundamentals: Second Edition, Revised and Expanded', edited by Monroe Schlessinger; Copyright 1998; pp. 431-433, pp. 500-501 & pp. 642-643.

"Activation Energies in Photochemically Modified Molecularly Doped Polymers" by J.W. Stasiak and T.J. Storch Lexmark International, Inc., Boulder, Colorado from 'NIP12 International Conference on Digital Printing Technologies' Oct. 27-Nov. 1, 1996; pp. 474-480.

"Reversible light-induced fatigue of two-layer organic photoconductors studied by time-of-flight photoconductivity measurements" by Y. Kanemitsu and H. Funada, Institute of Physics, University of Tsukuba, Tsukuba Ibaraki 305, Japan; received Oct. 16, 1990; pp. 1409-1415.

"Fatigue in hydrazone-based xerographic photoreceptors: Effect of ultraviolet irradiation" by C.K.H. Wong, Y.C. Chan, J. Pfleger and Y.W. Lam from 'Journal of Materials Research' vol. 12, No. 1, Jan. 1997; pp. 106-112.

"Thermally Stimulated Current Measurements on a UV Irradiated Organic Photoreceptor Layer" by D.P. Webb, Y.C. Chen. C.K.H. Wong, Y.W. Lam, K.M. Leung and D.S. Chiu from 'Journal of Electronic Materials, vol. 28, No. 5, 1997', pp. 470-473.

"Theoretical Calculations and Experimental Studies on the Electronic Structures of Hydrazones and Hydrazone Radical Cations: Formaldehyde Hydrazone and Benzaldehyde Diphenylhydrazones" by J. Pacansky, A.D McLean and M.D. Miller; J. Phys. Chem. 1990, 94, pp. 90-98.

"Photoconductor Fatigue. 1. Photochemistry of Hydrazone-Based Hole-Transport Molecules in Organic Layered Photoconductors: Spectroscopic Characterization and Effect on Electrical Properties" by J. Pacansky, R. J. Waltman, R. Grygier and R. Cox from 'American Chemical Society, Chem. Mater' vol. 3, No. 3, 1991; pp. 454-462.

"Photoconductor Fatigue. 2. Effect of Long-Wavelength Light on the Electrical and Spectroscopic Properties of Organic Layered Photoconductors" by J. Pacansky, R.J. Waltman and R. Cox from 'American Chemical Society, Chem. Mater'1991, 3, pp. 903-911.

"Photoconductor Fatigue. 3. Effect of Polymer on the Photooxidation of the Charge-Transport Layer of Organic Layered Photoconductors" by J. Pacansky and R.J. Waltman from 'American Chemical Society, Chem. Mater' 1991,3, pp. 912-917.

* cited by examiner

ELECTRONIC DEVICES CONTAINING ORGANIC SEMICONDUCTOR MATERIALS

BACKGROUND

Description of the Art

Over the past few years, the demand for ever cheaper and lighter weight portable electronic devices such as cell phones, personal digital assistants, portable computers, smart credit and debit cards has increased dramatically. This has led to a growing need to manufacture durable, lightweight, and low cost electronic circuits. The ability to fabricate such circuits is typically constrained by the need to utilize silicon-based semiconductors and processing.

Currently the fabrication of semiconducting circuits on polymer substrates, especially on flexible polymer substrates, is hindered by the typical harsh processing conditions for silicon-based devices such as high temperatures. Most polymer substrates have a relatively low melting or degradation temperature when compared to the deposition or annealing temperatures utilized in semiconductor processing. Thus, the semiconductor circuit elements are typically fabricated on semiconductor substrates such as single crystal silicon, and then separately mounted on the polymer substrate, requiring further interconnections, processing and cost.

One technique utilized to circumvent the lack of mechanical flexibility inherent in silicon-based devices is to use ultra thin flexible single crystal silicon wafers. However, this technique suffers from both the expense associated with the manufacture of such ultra thin wafers as well as the fragility problems associated with the handling of such wafers and dies.

Another methodology utilized to get around the need for wafer level processing is the use of amorphous silicon-based thin film transistors (TFTs). however, this technology generally requires processing temperatures in the range of 300° C. to 400° C. that typically results in the melting or severe degradation of most polymer substrates.

There are a number of other problems in fabricating semiconducting circuits on polymer substrates. In general, only a limited number of polymers, such as polyimides, are available that can withstand the temperatures utilized in fabricating silicon semiconducting circuits. In addition, compatibility can be an issue; for example the difference in thermal expansion between silicon and polymers is large, typically resulting in thermal stress that can affect device performance. Under some conditions it can lead to delamination of the silicon from the polymer substrate. Further, these polymers tend to have poor optical qualities for display applications and are specialized polymers that typically are expensive. The deposition of silicon typically requires sophisticated and expensive equipment that requires a vacuum and is optimized for deposition on wafers. These problems render impractical the manufacture of durable, lightweight, and low cost electronic circuits will remain impractical.

SUMMARY OF THE INVENTION

An electronic device includes first and second electrical contacts electrically coupled to a semiconductor polymer film, which includes mono-substituted diphenylhydrazone.

DESCRIPTION OF THE PREFERRED EMBODIMENTS

Figure 1:
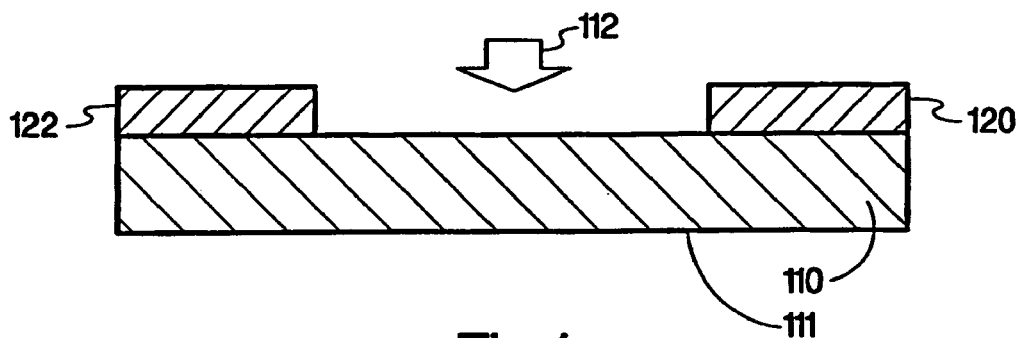
FIG. 1 is a cross-sectional view of a two terminal electronic device according to an embodiment of this invention.

Referring to FIG. 1, an exemplary embodiment of a two terminal device of the present invention is shown in a cross-sectional view. In this embodiment, electrical contacts 120 and 122 are formed on semiconducting polymer film 110. The dopant material utilized in semiconducting polymer film 110 is a mono-substituted diphenylhydrazone compound (DPH) having the structure R1-CH=N—N(C6H6)2, and preferably R1 may be saturated carbon chains of from C1 to C6, unsaturated carbon chains of from C1 to C6, a cyclohexyl group, a cyclopentyl group, unsubstituted phenyl groups, substituted phenyl groups, unsubstituted benzyl groups, substituted benzyl groups, and mixtures thereof. More preferably, the dopant material is a di-substituted amino benzaldehyde diphenylhydrazone having the structure R2R3—N—C6H6—CH=N—N(C6H6)2 where R2 and R3 may independently be saturated carbon chains of from C1 to C6, unsaturated carbon chains of from C1 to C6, a cyclohexyl group, a cyclopentyl group, unsubstituted phenyl groups, substituted phenyl groups, unsubstituted benzyl groups, substituted benzyl groups, and mixtures thereof. Particularly preferable is the compound p-(diethylamino) benzaldehyde diphenylhydrazone.

Preferably, the dopant material is added to a binder material in the range from about 10 weight percent to about 80 weight percent DPH, and more preferably from about 20 weight percent to about 50 weight percent of DPH. The thickness of semiconducting polymer film 110 is in the range from about 0.1 microns to about 25 microns, and preferably in the range of about 1 micron to 15 microns. However, depending upon electrical characteristics desired and the particular application of the device other thicknesses may be utilized.

As shown in FIG. 1, the exposure of semiconducting polymer film 110 to UV radiation can be utilized to tune the conductivity of semiconducting polymer film 110 to a particular value. Preferably, electrical contacts 120, and 122 are UV absorbent materials that may act as a self aligned mask for the UV exposure, however, any of the other standard techniques such as shadow masks, lasers, or photolithographic methods may also be utilized to expose selective areas.

The binder or matrix polymer for semiconducting film 110 may be selected from polycarbonate, polyester, polystyrene, polyvinylchloride, polymethylmethacrylate, polyvinyl acetate, vinylchloride/vinylacetate copolymers, acrylic resin, polyacrylonitrile, polyamide, polyketones, polyacrylamide, and other similar materials. The material chosen for the binder will depend on the particular electrical characteristics desired, processing conditions, as well as the environmental conditions in which the device will be utilized. However, for most applications, preferably, the binder is a polycarbonate, polystyrene, or polyester, and more preferably the binder is a polycarbonate. An exemplary binder material is a bisphenol-A-polycarbonate with a number average molecular weight (Mn) in the range from about 5,000 to about 50,000, more preferably from about 30,000 to about 35,000 and a polydispersity index of below about 2.5. An example of a commercially available polycarbonate that can be used as a binder or matrix polymer is a bisphenol-A-polycarbonate available from The Bayer Group under the trademark "MAKROLON-5208" that has an Mn of about 34,500 and a polydispersity index of about 2.

Electrical contacts 120 and 122 may be a metal layer, preferably, selected from gold, chromium, aluminum, indium, tin, lead, antimony, platinum, titanium, tungsten, tantalum, silver, copper, molybdenum, and similar metals as well as combinations thereof. In this embodiment, electrical contacts 120 and 122 may also be formed from conductive materials such as polyaniline, polypyrrole, pentacene, anthracene, napthacene, phenanthrene, pyrene, thiophene compounds, conductive ink, and similar materials. The material chosen for the electrical contacts will depend on the particular electrical characteristics desired, processing conditions, as well as the environmental conditions in which the device will be utilized. However, for most applications, preferably, the electrical contacts are formed from polyaniline or thiophene compounds such as poly (3,4-ethylene dioxythiophene) (PEDOT) or camphorsulfonic acid doped polyaniline. The thickness of the electrical contacts is preferably in the range from about 0.01 microns to about 1.0 micron, however, depending upon characteristics desired both thicker and thinner contacts may be utilized. These metals and conductive materials as well as thickness ranges can also be utilized as the electrical contacts in the alternate embodiments described and shown below.

Figure 2A:
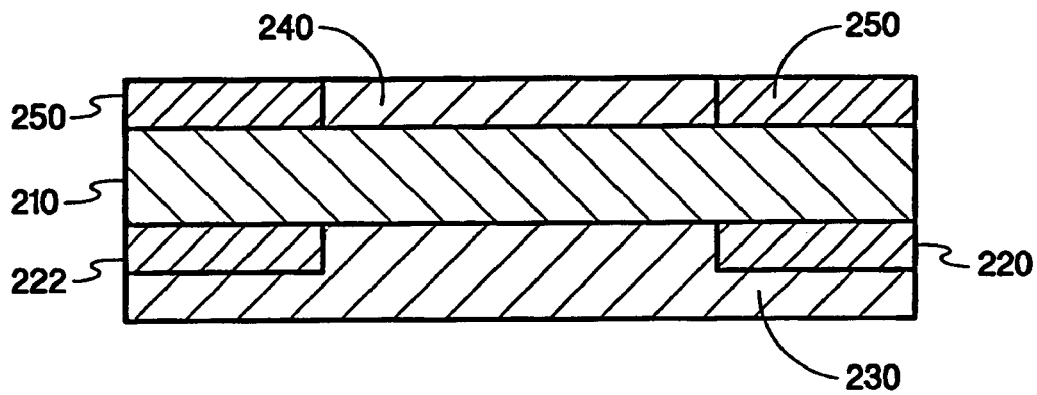
FIG. 2a is a cross-sectional view of a two terminal electronic device according to an embodiment of this invention.

An alternate embodiment of the present invention is shown in a cross-sectional view in FIG. 2a. In this embodiment, semiconducting polymer film or layer 210 is created over substrate 230. Electrical contacts 220 and 222, are electrically coupled to semiconducting polymer film 210 as shown in FIG. 2a, and are created in substrate 230. However, electrical contacts 220 and 222 can also be created on substrate 230, and may be created from any of the metals or conductive materials, as described above, for the embodiment shown in FIG. 1. In addition, electrical contacts 220 and 222 may be formed on top of semiconductor polymer layer 210 (not shown) and thus, may act as a self aligned mask for the UV exposure as described above. Passivation layer 250 is created over semiconductor polymer film 210 and protects semiconductor polymer film from damage and environmental degradation. UV transmitting window 240 is created over a portion of semiconducting polymer film 210 providing the ability to tune the conductivity of semiconducting polymer film 210 to a particular value.

Substrate 230 may be formed from a wide variety of materials such as silicon, gallium arsenide, glass, ceramic materials, and harder, more brittle plastics may all be utilized. In addition, metals and alloys can also be utilized. In particular, metals such as aluminum and tantalum that electrochemically form oxides, such as anodized aluminum or tantalum, can be utilized. Preferably, substrate 230 is created from a flexible polymer material such as polyimide, polyester (PET), polyethylene naphthalate (PEN), as polyvinyl chloride, polybutylene terephthalate (PBT), polyethylene naphthalate (PEN), polypropylene (PP), polyethylene (PE), polyurethane, polyamide, polyarylates, and polyester based liquid-crystal polymers to name a few. More preferably, substrate 230 is formed from PET or PEN. The thickness of substrate 230 preferably ranges from about 5 to about 500 microns and more preferably from about 5 to about 50 microns thick and particularly preferable is a range from about 10 to about 25 microns thick.

UV transmitting window 240 can be created from any material having at least a 75 percent transmittance in the wavelength region from about 250 nm to about 500 nm. Preferably UV transmitting window 240 is created from indium tin oxide, silicon dioxide, polycarbonate, polystyrene or combinations thereof. The thickness of UV transmitting window 240, preferably, is in the range from about 0.5 microns to about 1.0 micron; however, other thicknesses can be utilized depending on the particular application of the circuit.

Passivation layer 250 can be created from a material having less than about 15 percent transmittance in the wavelength region from about 250 nm to about 500 nm. Preferably passivation layer 250 has a transmittance of less than 5 percent in the above described wavelength region. Passivation layer 250, preferably, is formed from any of a wide range of polymeric materials such as polyimide, polyetherimides, polybutylene terephthalate, polyester, polyethylene naphthalate (PEN), or epoxy, to name a few. If electrical contacts 220 and 222 are formed to act as a self aligned mask for the UV exposure, as described above, then passivation layer 250 may be formed from the same material as UV transmitting window 240.

Figure 2B:
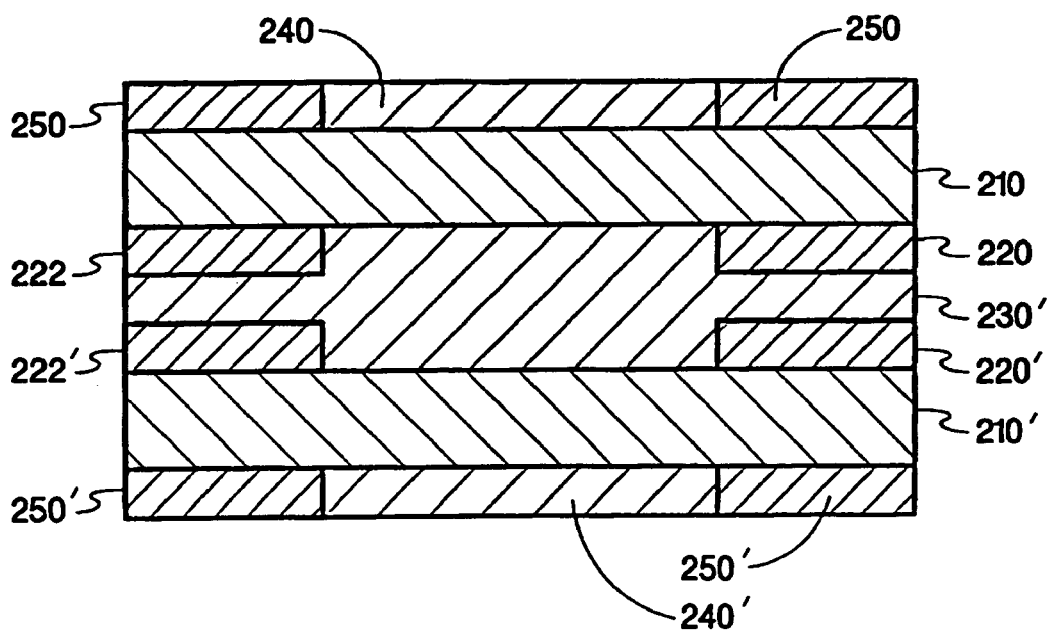
FIG. 2b is a cross-sectional view of a two terminal electronic device according to an embodiment of this invention.

An alternate embodiment of the present invention is shown in a cross-sectional view in FIG. 2b. In this embodiment, two semiconducting polymer films or layers 210 and 210' are created on substrate 230'. Semiconducting polymer layer 210 is formed on a first side of substrate 230' analogous to the structures s described above and shown in FIG. 2a. Electrical contacts 220 and 222 are electrically coupled to semiconducting polymer layer 210 and passivation layer 250 and UV transmitting window 240 are formed over semiconducting polymer layer 210.

In addition, in this embodiment a second semiconducting polymer layer 210' is formed on a second side of substrate 230' as shown in FIG. 2b. Electrical contacts 220' and 222' are electrically coupled to semiconducting polymer layer 210' and passivation layer 250' and UV transmitting window 240' are formed over semiconducting polymer layer 210'. The structure, properties and materials utilized in the previous embodiments described above can be utilized in this embodiment as well.

Figure 3:
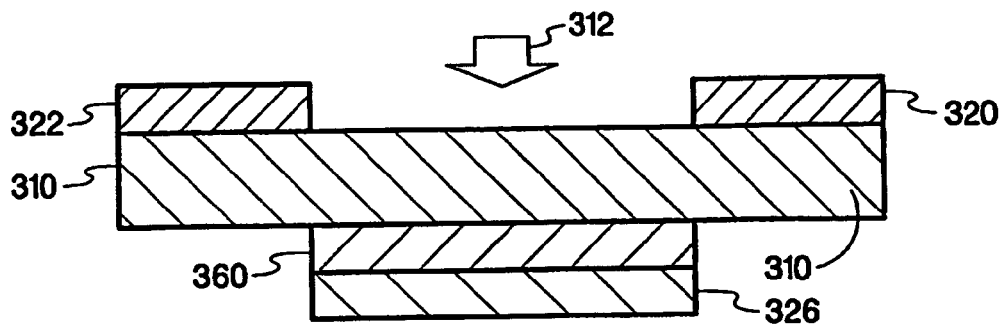
FIG. 3 is a cross-sectional view of a three terminal electronic device according to an embodiment of this invention.

Referring to FIG. 3, an exemplary embodiment of a three terminal device of the present invention is shown in a cross-sectional view. In this embodiment, electrical contacts 320 and 322 are formed on, and electrically coupled to, semiconducting polymer film 310. In addition, electrical contact 326 is electrically coupled to semiconducting polymer film 310 via insulator 360 that is in contact with semiconducting polymer film 310. Semiconducting polymer film 310 utilizes the dopant DPH. Insulator 360 is a dielectric material, preferably a polymer that is non-polar, and more preferably polystyrene. However, other polymers such as polycarbonate, polyethylene, polypropylene, and polyvinylphenol as well as metal oxides and carbides, to name just a few, may also be utilized. In addition, the materials and properties described above for the semiconducting polymer layer utilized in the two terminal device may be utilized in this embodiment. Further, the structures, properties and materials for the electrical contacts described above in the two terminal device can also be utilized in this embodiment for the three terminal device.

As shown in FIG. 3, the exposure of semiconducting polymer film 310 to UV radiation can be utilized to tune the conductivity of semiconducting polymer film 310 to a particular value. Preferably, electrical contacts 320, and 322 are UV absorbent materials that may act as a self-aligned mask for the UV exposure; however, other standard techniques such as shadow masks or photolithographic methods may also be utilized to expose selective areas.

Figure 4A:
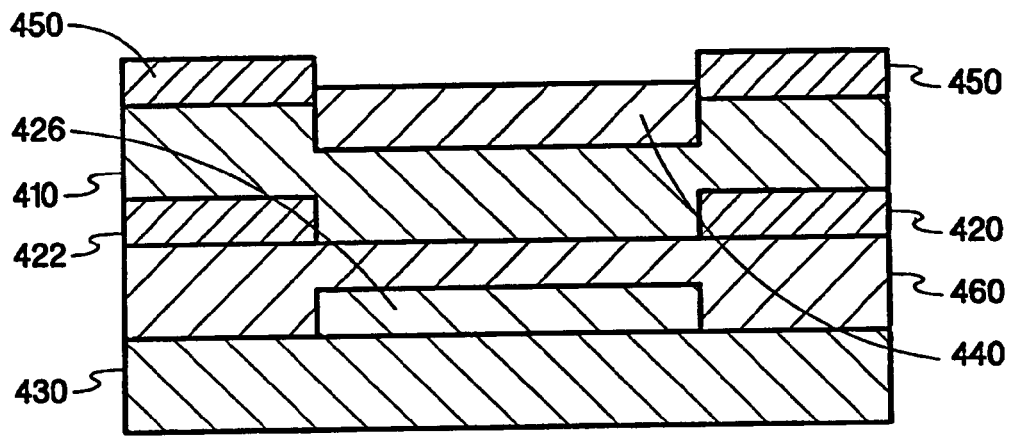
FIG. 4a is a cross-sectional view of a three terminal electronic device according to an embodiment of this invention.

An alternate embodiment of a three terminal device of the present invention is shown in a cross-sectional view in FIG. 4a. In this embodiment, electrical contact 426 is formed on substrate 430 and insulator 460 is created at least over electrical contact 426 and may be formed as a layer over substrate 430. Electrical contacts 420 and 422 are created on insulator 460, with semiconducting polymer film 410 formed over electrical contacts 420 and 422, and insulator 460 as shown in FIG. 4a. Passivation layer 450 and UV transmitting window 440 are created over semiconducting film 410 as described, for the two terminal device, above and shown in FIG. 2a. Another structure that may be utilized is one in which electrical contacts 420 and 422 are created over semiconducting film 410 (not shown) and thus, may act as a self aligned mask for the UV exposure as described above.

Figure 4B:
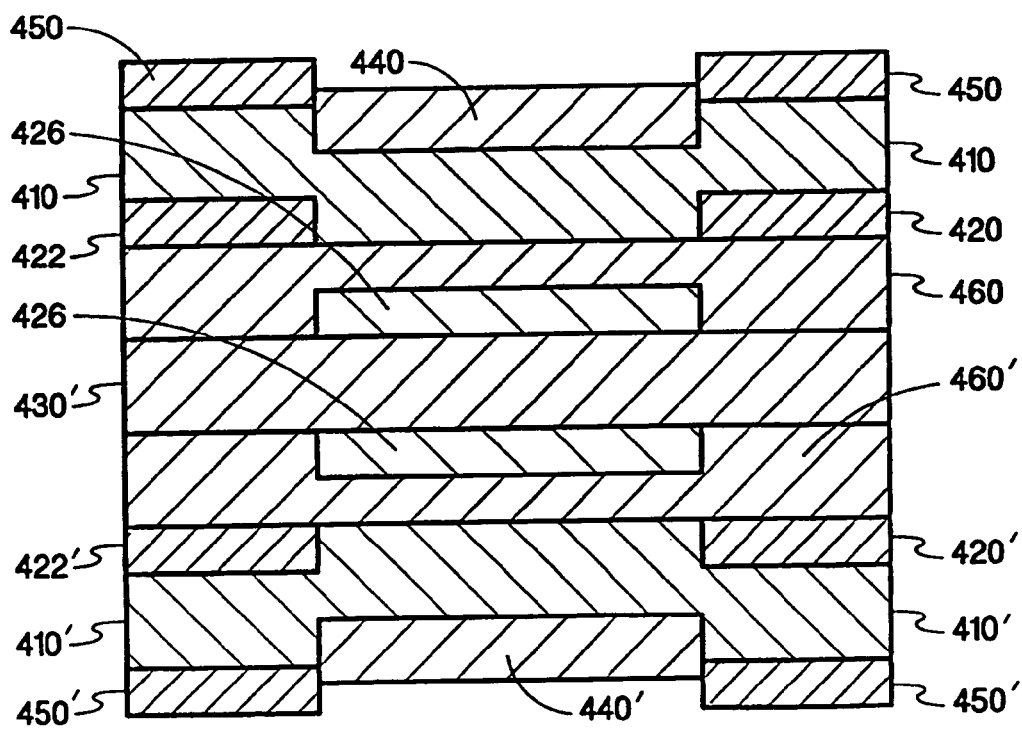
FIG. 4b is a cross-sectional view of a three terminal electronic device according to an embodiment of this invention.

An alternate embodiment of a three terminal device of the present invention is shown in a cross-sectional view in FIG. 4b. In this embodiment, two semiconducting polymer films or layers 410 and 410' are created on substrate 430'. Semiconducting polymer layer 410 is formed on a first side of substrate 430' analogous to the structures described above and shown in FIG. 4a. Electrical contact 426 is formed on substrate 430' and insulator 460 is created at least over electrical contact 426 and may be formed as a layer over substrate 430'. Electrical contacts 420 and 422 are created on insulator 460, with semiconducting polymer film 410 formed over electrical contacts 420 and 422, and insulator 460 as shown in FIG. 4a. Passivation layer 450 and UV transmitting window 440 are created over semiconducting film 410 as described, for the two terminal device, above and shown in FIG. 2a. Another structure that may be utilized is one in which electrical contacts 420 and 422 are created over semiconducting film 410 (not shown) and as described above.

In addition, in this embodiment a second semiconducting polymer layer 410' is formed on a second side of substrate 430' as shown in FIG. 4b. Electrical contact 426' is electrically coupled to semiconductor polymer layer 410', and is formed on substrate 430'. Insulator 460' is created at least over electrical contact 426' and may be formed as a layer over substrate 430'. Electrical contacts 420' and 422' are electrically coupled to semiconducting polymer layer 410', and passivation layer 450' and UV transmitting window 440' are formed over semiconducting polymer layer 410'. The structure, properties and materials utilized in the previous embodiments described above can be utilized in this embodiment as well.

Figure 5:
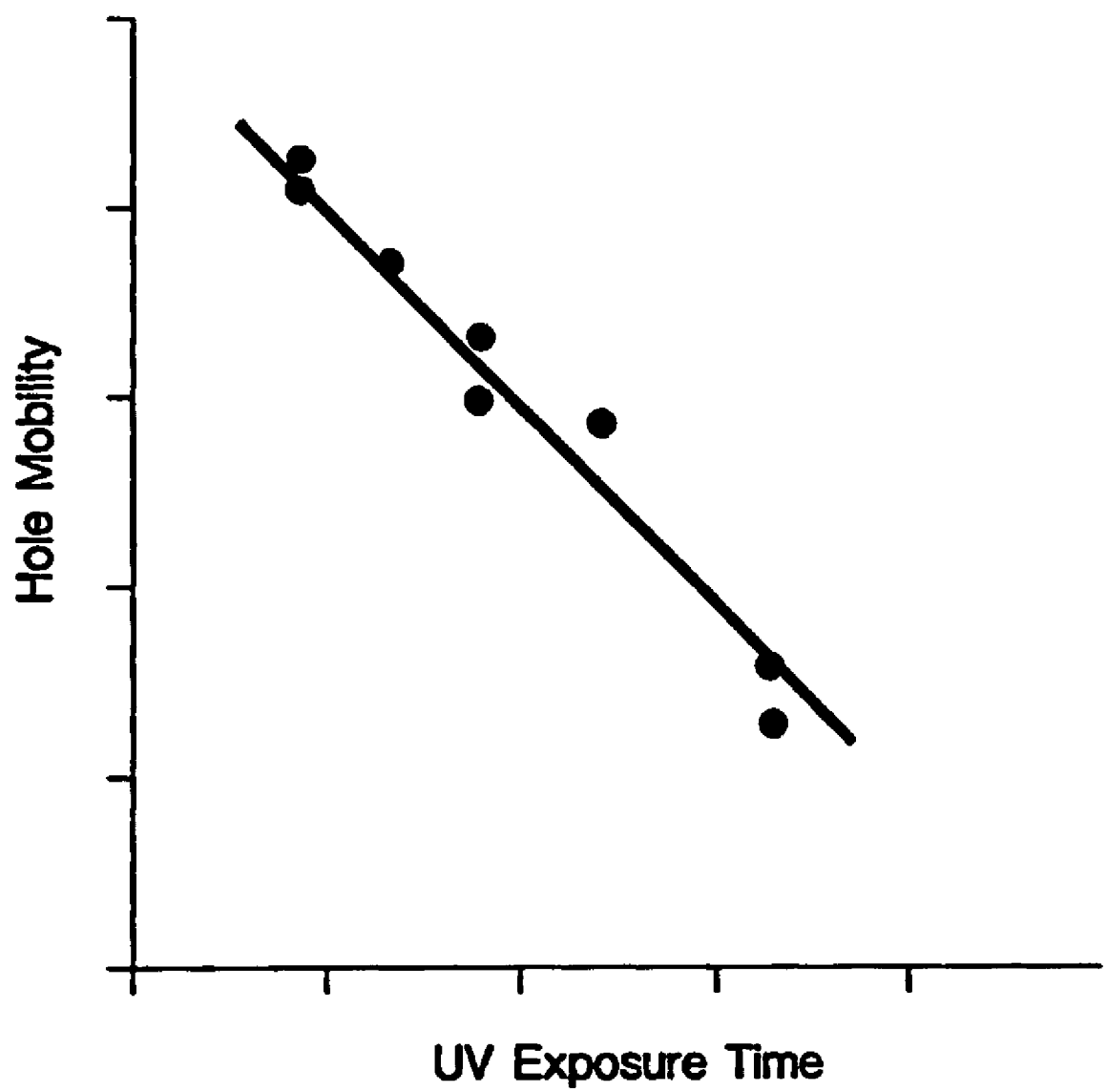
FIG. 5 is a graph of the zero field hole mobility in $cm^2$ per volt second as a function of W exposure time in minutes according to an embodiment of this invention.

The change in the zero field hole mobility in $cm^2$ per volt second as a function of UV exposure time in minutes is graphically shown in FIG. 5. The semiconducting polymer film was exposed using a medium pressure 450 Watt mercury vapor lamp, although other sources of UV light could be used. The semiconducting polymer film used to obtain the data for FIG. 5 was prepared by dissolving 41 weight percent of N,N-diethylamino benzaldehyde-1,1-diphenylhydrazone (DEH) and bisphenol-A-polycarbonate in HPLC grade tetrahydrofuran. Samples were then prepared by solvent coating the above solution onto semitransparent aluminized PET substrates. The coated substrates were oven dried, in air, at 100 C. for one hour to reduce residual solvent content Electrical contacts were created using an electron beam evaporation process. The gold contacts were approximately 1 cm. in diameter and about 0.5 microns thick. The average film thickness of the semiconducting polymer film was about 11.0 microns. As the exposure time is increased, more and more DEH molecules are photoconverted, thereby effectively removing DEH molecules from the charge transport process, resulting in a decrease in the hole conductivity in the molecularly doped polymeric circuit element. As shown in FIG. 5, UV exposure results in a decrease of approximately three orders of magnitude in the charge mobility of the semiconductor polymer film. The decrease in conductivity, generated by exposure to UV light, can be reversed by heating the sample above the glass transition temperature of the binder material utilized in the semiconductor polymer film.

Figure 6A:
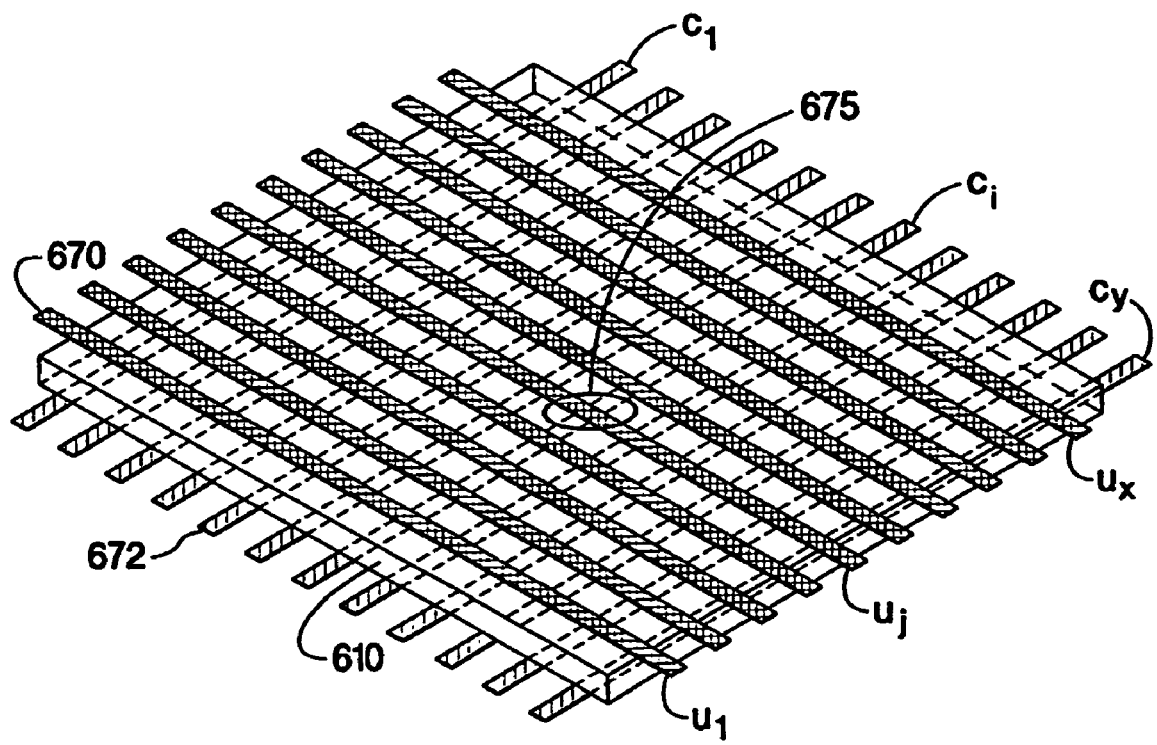
FIG. 6a is a perspective view of a photosensitive programmable array according to an embodiment of this invention.

Referring to FIG. 6a, an exemplary embodiment of a photosensitive programmable array of the present invention is shown in a perspective view. In this embodiment, semiconducting polymer film 610 forms a functional medium having a non-linear impedance characteristic. On the top surface, also referred to as the first side, of semiconducting polymer film 610, a plurality of electrical conductors 670 are formed and are denoted as $U_j$. Electrical conductors 670 are s substantially parallel to each other. On the bottom surface, also referred to as the second side, of semiconducting polymer film 610 are formed a corresponding plurality of electrical conductors 672 that are substantially parallel to each other and are substantially mutually orthogonal to electrical conductors 670. The electrical conductors 672 are denoted as $C_I$ The combination of electrical conductors 670 and 672 form a planar orthogonal x, y matrix. Logic cell 675 is formed in the volume between any two intersecting electrical conductors.

Figure 6B:
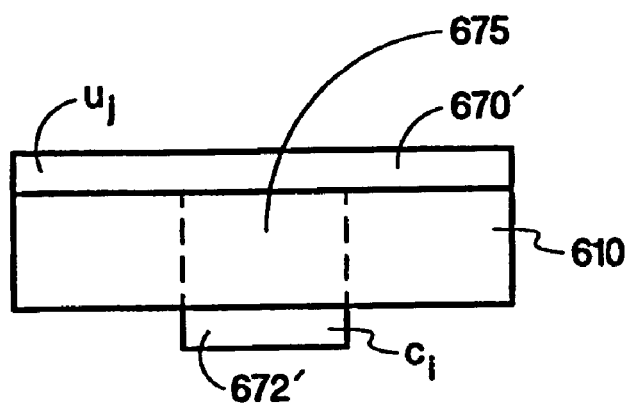
FIG. 6b is a cross-sectional view of a logic cell according to an embodiment of this invention.

A more detailed cross-sectional view of logic cell 675 is shown in FIG. 6b. In this embodiment, electrical conductor 670' is an electrically conductive material having at least a 75 percent transmittance in the wavelength region from about 250 nm to about 500 nm such as indium tin oxide. Electrical conductor 672 may be formed from any of the electrically conductive materials for the two and three terminal devices described above. Semiconducting polymer film 610 is also formed from any of the materials described above for the semiconductor layer utilized in two and three terminal devices.

As described earlier (see FIG. 5) the exposure of semiconducting polymer film 610 will result in a decrease in conductivity. Thus, by selectively exposing the volume of the semiconductor polymer film between any two intersecting electrical conductors, the conductivity of a logic cell can be reduced. The change in conductivity depends on the time of exposure to UV radiation. The electrical conductivity of the exposed volume of semiconducting polymer changes state from conductive to substantially non-conductive. Such a resultant change can be a difference of up to three orders of magnitude or more in conductivity, as shown in FIG. 5, whereby the photoconversion process produces a high resistance bridge or open link. The selective exposure of various logic cells to UV radiation is preferably by laser pulses; however, any of the other standard techniques such as shadow masks or photolithographic methods may also be utilized to expose selective cells. An array of passive logic cells can be formed that are either in a conductive or non-conductive state representing a 0 or 1. In addition, the present invention also enables the ability to restore a non-conductive logic cell, that was exposed to UV radiation, to a conductive state by heating the volume of the semiconductor polymer film above the glass transition temperature of the binder material utilized. This heating operation can preferably be performed using a laser pulse, although other heating techniques can also be utilized.

Figure 6C:
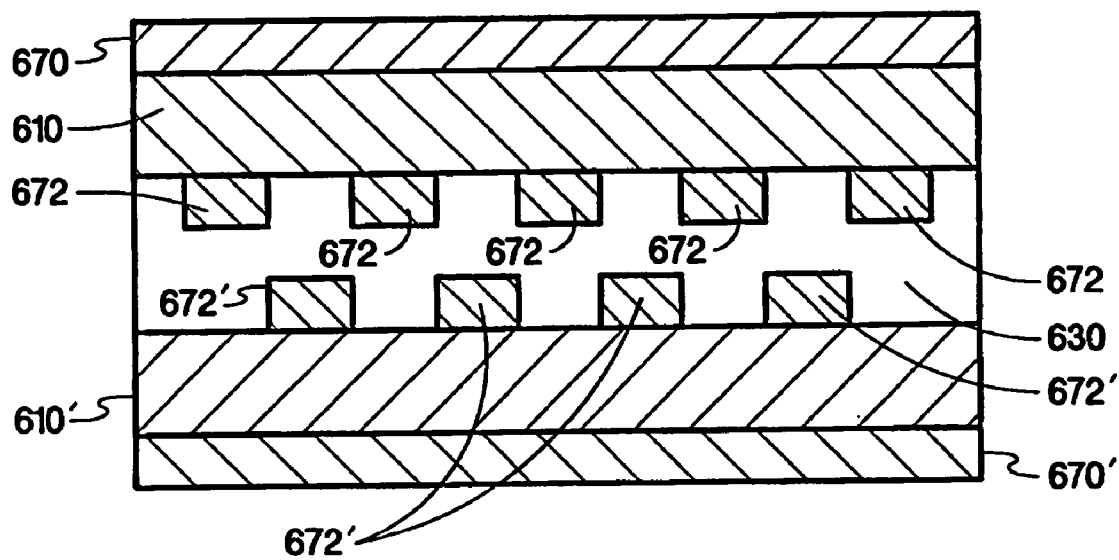
FIG. 6c is a cross-sectional view of a photosensitive programmable array according to an embodiment of this invention.

An alternate embodiment of the present invention is shown in a cross-sectional view in FIG. 6c. In this embodiment, two semiconducting polymer films or layers 610 and 610' are created on substrate 630'. A plurality of electrical conductors 672 are electrically coupled to the bottom surface of semiconducting layer 610 and are formed on the first side of substrate 630. However, the plurality of electrical conductors 672 may also be created on substrate 630, and may be created from any of the metals or conductive materials as described above. On the top surface of semiconducting polymer film 610 a plurality of electrical conductors 670 are formed and are substantially mutually orthogonal to electrical conductors 672.

A plurality of electrical conductors 672' are electrically coupled to the bottom surface of semiconducting layer 610' and are formed on the second side of substrate 630. However, the plurality of electrical conductors 672' may also be created on substrate 630, and may be created from any of the metals or conductive materials as described above. On the top surface of semiconducting polymer film 610' a plurality of electrical conductors 670' are formed and are substantially mutually orthogonal to electrical conductors 672'. Such a dual layer photosensitive programmable array provides on the order of 5.0 Gbits/cm2 using traditional lithographic technologies for patterning and creating the electrical conductors. Patterning of the semiconductor polymer layer 610 and 610' is not required to achieve this bit density.

Figure 7:
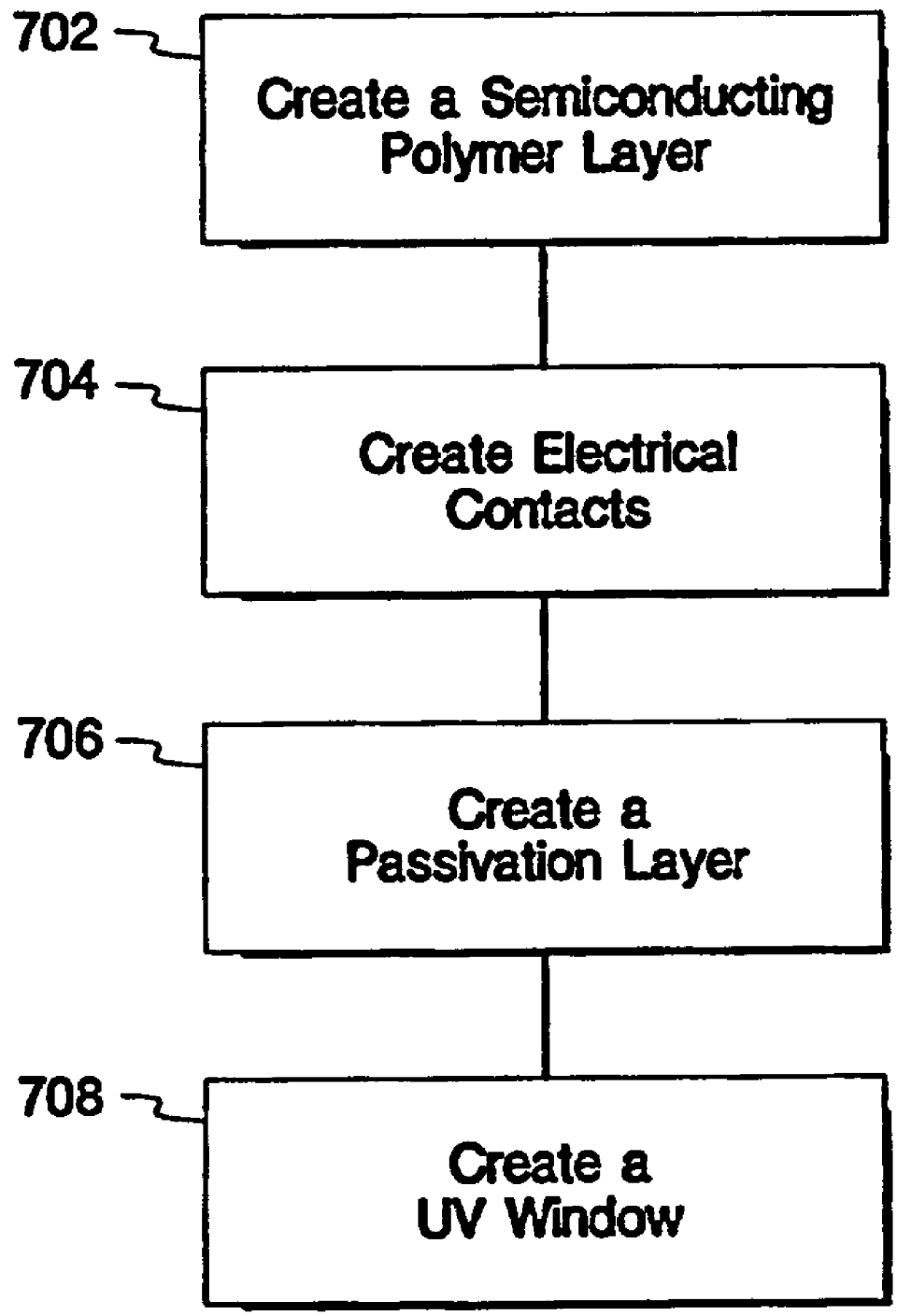
FIG. 7 is a flow chart of a method of fabricating an electronic device according to an embodiment of this invention.

A method of manufacturing an electronic device utilizing a semiconducting layer including DPH is shown as a flow diagram in FIG. 7. Although the description will describe the process utilized to fabricate a single layer device on one side of the substrate, the process used to form a dual layer structure, as shown in FIGS. 2b, 4b, and 6c, is accomplished by repeating the steps described on the second side of the substrate. In step 702 a semiconducting polymer layer including DPH is created. The particular binder chosen will depend, for example, on the particular electronic properties desired, the environment in which the device will be used, whether a two or a three terminal device or a programmable array or some combination thereof will be utilized. Depending on the particular binder chosen the appropriate solvents are utilized that provide sufficient solubility for both the binder and the DPH as well as providing appropriate viscosity for the particular coating or casting process chosen. An exemplary process for creating a semiconductor polymer layer uses HPLC grade tetrahydrofuran as a solvent to dissolve the binder bisphenol-A-polycarbonate and the DPH in appropriate concentrations to obtain the desired electrical properties. If a substrate is utilized, as shown, for example, in FIGS. 2a and 2b, then the composition and properties of the substrate are also taken into consideration, in order to obtain good adhesion between the substrate and the semiconductor polymer layer.

The creation of electrical contacts is accomplished in step 704. Depending on the particular material chosen to generate the electrical contact this step may consist of sputter deposition, electron beam evaporation, thermal evaporation, or chemical vapor deposition of either metals or alloys. Conductive materials such as polyaniline, polypyrrole, pentacene, thiophene compounds, or conductive inks, may utilize any of the techniques used to create thin organic films may be utilized. For example, screen printing, spin coating, dip coating, spray coating, ink jet deposition and in some cases, as with PEDOT, thermal evaporation are techniques that may be used. Depending on the particular electronic device being fabricated, the electrical contacts may be created either on a substrate or directly on the semiconducting polymer film. Patterning of the electrical contacts is accomplished by any of the generally available photolithographic techniques utilized in semiconductor processing. However, depending on the particular material chosen, other techniques such as laser ablation or ink jet deposition may also be utilized. In addition, combinations of different conductive materials may also be utilized that might result in very different processes being utilized. For example in a programmable array it may be desirable to utilize PEDOT as the material for the lower electrical traces and indium tin oxide for the upper UV transmitting electrical traces.

In step 706 a passivation layer is created to protect the semiconductor polymer film from damage and environmental degradation when appropriate. Any of the techniques mentioned above for the creation of the electrical contacts may also be utilized to create the passivation layer. In addition to those techniques, any of the techniques utilized to create dielectric materials and films may also be utilized as well as techniques such as lamination and casting.

The creation of an UV transmitting window to enable photoconversion of the DPH molecules is accomplished in step 708 when appropriate. Any of techniques mentioned above for creation of the passivation layer or electrical contacts may also be utilized to create the UV transmitting window depending on the particular material chosen for the window. For example, if the UV transmitting window is a polycarbonate material, then casting, spin coating, or screen printing are just a few examples of the processes that can be used to create the window. However, if for example, silicon dioxide is used as the window material then spin coating of a spin on glass material or sputter deposition or chemical vapor deposition may be utilized.

What is claimed is:

1. An electronic device, comprising:
 a first semiconducting polymer film, which includes mono-substituted diphenylhydrazone (DPH), disposed between and in physical contact with a first electrical contact and a second electrical contact.

2. The electronic device of claim 1, wherein a predetermined exposure of said semiconducting polymer to ultraviolet radiation, reduces the electrical conductivity of said exposed semiconducting polymer.

3. The electronic device of claim 1, further comprising:
 a first insulator in contact with at least a portion of said first semiconducting polymer layer; and a third electrical contact in contact with at least a portion of said first insulator.

4. The electronic device of claim 3, wherein said first electrical contact, further comprises a conductive material selected from the group consisting of polyaniline, polypyrrole, pentacene, anthracene, napthacene, phenanthrene, pyrene, thiophene, conductive ink, and combinations thereof.

5. The electronic device of claim 3, wherein said third electrical contact, further comprises a conductive material selected from the group consisting of polyaniline, polypyrrole, pentacene, anthracene, napthacene, phenanthrene, pyrene, thiophene, conductive ink, and combinations thereof.

6. The electronic device of claim 3, wherein said first electrical contact, is comprised of a metal selected from the group consisting of gold, chromium, aluminum, platinum, titanium, tungsten, tantalum, silver, copper, molybdenum, and combinations thereof.

7. The electronic device of claim 3, wherein said third electrical contact is comprised of a metal selected from the group consisting of gold, chromium, aluminum, platinum, titanium, tungsten, tantalum, silver, copper, molybdenum, and combinations thereof.

8. The electronic device of claim 3, wherein said first insulator is a polymer.

9. The electronic device of claim 8, wherein said first polymer insulator is selected from the group consisting of polycarbonate, polystyrene, polyvinylphenol, polyethylene, polypropylene, and mixtures thereof.

10. The electronic device of claim 1, further comprising a first passivation layer disposed over a portion of said first semiconducting polymer layer.

11. The electronic device of claim 10, wherein said first passivation layer is selected from the group consisting of polyimide, polyetherimides, polyester, polyethylene naphthalate, epoxy, polybutylene terephthalate, and mixtures thereof.

12. The electronic device of claim 1, further comprising a first ultraviolet transmitting window disposed over a portion of said first semiconducting polymer layer.

13. The electronic device of claim 12, wherein said first ultraviolet transmitting window has a transmittance of at least 75% in the wavelengths from about 250 nm to about 500 nm.

14. The electronic device of claim 12, wherein said first ultraviolet transmitting window material is selected from the group consisting of silicon dioxide, polycarbonate, polystyrene, indium tin oxide, polyethylene terephthalate, and combinations thereof.

15. The electronic device of claim 1, wherein said first semiconducting polymer layer includes DPH in the range from about 20 weight percent to about 50 weight percent.

16. The electronic device of claim 1, further comprising a substrate having a first side and a second side wherein said first electrical contact, said second electrical contact, and said first semiconducting polymer layer are disposed over said first side of said substrate.

17. The electronic device claim 16, further comprising:
a fourth electrical contact and a fifth electrical contact disposed over said second side of said substrate; and
a second semiconducting polymer film, which includes mono-substituted diphenylhydrazone (DPH), disposed over said second side of said substrate, and electrically coupled to said third electrical contact and said fourth electrical contact.

18. The electronic device of claim 17, further comprising:
a second insulator in contact with at least a portion of said second semiconducting polymer layer; and
a sixth electrical contact in contact with at least a portion of said second insulator.

19. The electronic device of claim 17, further comprising a second passivation layer disposed over a portion of said second semiconducting polymer layer.

20. The electronic device of claim 17, further comprising a second ultraviolet transmitting window disposed over a portion of said second semiconducting polymer layer.

21. The electronic device of claim 17, wherein said second semiconducting polymer layer includes DPH in the range from about 20 weight percent to about 50 weight percent.

22. The electronic device of claim 16, wherein said substrate is flexible.

23. The electronic device of claim 22, wherein said flexible substrate is selected from the group consisting of polyethylene terephthalate, polyethylene naphthalate, polyimide, polyacrylate, liquid crystal polymer, polyvinyl chloride, polyamide, polyarylates, polybutylene terephthalate, and combinations thereof.

24. The electronic device of claim 16, wherein said substrate is selected from the group consisting of silicon, glass, polycarbonate, aluminum oxide, and boron nitride.

25. The electronic device of claim 1, having the structure R1-CH=N—N(C6H6)2, wherein said R1 is selected from the group consisting of saturated carbon chains of from C1 to C6, unsaturated carbon chains of from C1 to C6, a cyclohexyl group, a cyclopentyl group, unsubstituted phenyl groups, substituted phenyl groups, unsubstituted benzyl groups, substituted benzyl groups, and mixtures thereof.

26. The electronic device of claim 1, wherein said mono-substituted diphenylhydrazone is (R2R3-amino) benzaldehyde diphenylhydrazone, wherein said R2 and said R3 substituents are independently selected from the group consisting of saturated carbon chains of from C1 to C6, unsaturated carbon chains of from C1 to C6, a cyclohexyl group, a cyclopentyl group, unsubstituted phenyl groups, substituted phenyl groups, unsubstituted benzyl groups, substituted benzyl groups, and mixtures thereof.

27. The electronic device of claim 1, wherein said mono-substituted diphenylhydrazone is selected from the group consisting of N,N-diethylamino benzaldehyde-1,1-diphenylhydrazone, N,N-dimethylamino benzaldehyde-1,1-diphenylhydrazone, N,N-diphenylamino benzaldehyde-1,1-diphenylhydrazone, N,N-dibenzylamino benzaldehyde-1,1-diphenylhydrazone, and mixtures thereof.

28. The electronic device of claim 1, wherein heating said semiconducting polymer film above the glass transition temperature of a binder polymer increases the electrical conductivity of said semiconducting polymer film.

29. An electronic device, comprising:
a first electrical contact and a second electrical contact; and
a first semiconducting polymer layer including p-(diethylamino) benzaldehyde diphenylhydrazone (DEH) electrically and physically in contact with said first electrical contact, and said second electrical contact.

30. An electrically addressable device, comprising:
a first semiconducting polymer film, which includes mono-substituted diphenylhydrazone (DPH), having a first side and a second side;
a first plurality of electrical conductors substantially parallel to each other in contact with said first side of said semiconducting polymer layer; and a first plurality of ultraviolet transmitting electrical conductors substantially parallel to each other, in contact with said second side of said first semiconducting polymer layer and substantially mutually orthogonal to said first plurality of electrical conductors.

31. The electronic device of claim 30, further comprising a substrate having a first side and a second side, wherein said first plurality of electrical conductors is disposed over said first side of said substrate.

32. The electronic device of claim 31, further comprising:
a second plurality of electrical conductors substantially parallel to each other disposed over said second side of said substrate; a second semiconducting polymer film, which includes mono-substituted diphenylhydrazone (DPH)disposed over said second side of said substrate, and in contact with said second plurality of electrical conductors; and
a second plurality of ultraviolet transmitting electrical conductors substantially parallel to each other, in contact with said second semiconducting polymer layer and substantially mutually orthogonal to said second plurality of electrical conductors.

33. The electronic device of claim 30, wherein said first plurality of ultraviolet transmitting electrical conductors further comprises indium tin oxide.

34. The electronic device of claim 30, wherein said first semiconducting polymer layer includes DPH in the range from about 20 weight percent to about 50 weight percent.

35. A method of manufacturing an electrically addressable device, comprising the steps of:
creating a first semiconductor polymer film, which includes mono-substituted diphenylhydrazone (DPH), having a first side and a second side;
creating a first plurality of electrical conductors substantially parallel to each other in contact with said first side of said first semiconducting polymer layer; and
creating a first plurality of ultraviolet transmitting electrical conductors substantially parallel to each other, in contact with said second side of said first semiconducting polymer layer and substantially mutually orthogonal to said first plurality of electrical conductors.

36. The method of claim 35, further comprising the steps of:
creating a substrate having a first side and a second side, wherein said first plurality of electrical conductors is disposed over said first side of said substrate
creating a second plurality of electrical conductors substantially parallel to each other disposed on said second side of said substrate;
creating a second semiconducting polymer film, which includes mono-substituted diphenylhydrazone (DPH), disposed over said second side of said substrate, and in contact with said second plurality of electrical conductors; and
creating a second plurality of ultraviolet transmitting electrical conductors substantially parallel to each other, in contact with said second semiconducting polymer layer and substantially mutually orthogonal to said second plurality of electrical conductors.

37. A method of changing the property of a semiconducting polymer film, comprising the steps of:
exposing a semiconducting polymer film, which includes mono-substituted diphenylhydrazone (DPH), to ultraviolet radiation, said semiconducting polymer film disposed between and in physical contact with a first electrical contact and a second electrical contact;
waiting for a specified period of time; and
stopping exposure of said semiconducting polymer film to ultraviolet radiation, wherein the zero field hole mobility of said semiconducting polymer film is reduced.

38. A method of reducing the electrical conductivity of a logic cell, comprising the steps of:
exposing a semiconducting polymer film, which includes mono-substituted diphenylhydrazone (DPH), to ultraviolet radiation, said semiconducting polymer film disposed between and in physical contact with a first electrical contact and a second electrical contact;
waiting for a specified period of time; and
stopping exposure of said semiconducting polymer film to ultraviolet radiation, wherein the electrical conductivity of said exposed semiconducting polymer film is reduced.

39. The method of claim 38, wherein the electrical conductivity of said exposed semiconducting polymer changes state from conductive to substantially non-conductive.

40. A method of restoring the electrical conductivity of a semiconducting polymer film comprising the step of heating a semiconducting polymer, which includes mono-substituted diphenylhydrazone (DPH), above the glass transition temperature of a binder polymer, said semiconducting polymer film disposed between and in physical contact with a first electrical contact and a second electrical contact.

* * * * *

UNITED STATES PATENT AND TRADEMARK OFFICE
CERTIFICATE OF CORRECTION

PATENT NO.        : 7,276,727 B2                                            Page 1 of 1
APPLICATION NO.   : 11/039444
DATED             : October 2, 2007
INVENTOR(S)       : James Stasiak It is certified that error appears in the above-identified patent and that said Letters Patent is hereby corrected as shown below:

In column 2, line 17, delete "W" and insert -- UV --, therefor.

In column 10, line 58, in Claim 29, delete "(DEH)" and insert -- (DPH) --, therefor.

In column 11, line 31, in Claim 35, delete "semiconductor" and insert
-- semiconducting --, therefor.

Signed and Sealed this

Seventeenth Day of March, 2009

JOHN DOLL
*Acting Director of the United States Patent and Trademark Office*